United States Patent
Ye et al.

(10) Patent No.: US 6,929,496 B2
(45) Date of Patent: Aug. 16, 2005

(54) SOCKET CONNECTOR WITH ACTUATOR MECHANISM MATING MEANS

(75) Inventors: Hui Ye, Kunsan (CN); Guoliang Zheng, Kunsan (CN); Jin-Min Zeng, Kunsan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/836,938

(22) Filed: Apr. 30, 2004

(65) Prior Publication Data

US 2004/0219818 A1 Nov. 4, 2004

(30) Foreign Application Priority Data

Apr. 30, 2003 (TW) ..................................... 92206970 U

(51) Int. Cl.⁷ .......................................... H01R 13/625
(52) U.S. Cl. ..................................................... 439/342
(58) Field of Search ................................ 439/342, 259, 439/260, 266

(56) References Cited

U.S. PATENT DOCUMENTS

| | | | |
|---|---|---|---|
| 6,599,146 B2 * | 7/2003 | Liao | 439/342 |
| 6,699,056 B2 * | 3/2004 | He et al. | 439/342 |
| 6,739,895 B2 * | 5/2004 | Yu | 439/342 |
| 6,746,262 B2 * | 6/2004 | He et al. | 439/342 |
| 6,746,263 B2 * | 6/2004 | Luo | 439/342 |

FOREIGN PATENT DOCUMENTS

| | | |
|---|---|---|
| TW | 481360 | 3/2002 |
| TW | 481375 | 3/2002 |
| TW | 481378 | 3/2002 |
| TW | 502882 | 9/2002 |

* cited by examiner

*Primary Examiner*—Gary Paumen
(74) *Attorney, Agent, or Firm*—Wei Te Chung

(57) ABSTRACT

A socket connector (1) for electrically interconnecting a CPU package and a PCB includes a base (10), a cover (13) slidably mounted on the base, an actuator mechanism (14) sandwiched between the cover and the base, and a plurality of terminals (15) received in the base. The base defines an actuator channel (120) having a protrusion block (121) in a middle thereof, and an array of terminal-passages (110) receiving the terminals therein. The actuator mechanism includes a shaft (140) having a protrusion (1402) corresponding to the protrusion block, and a handle lever (141) extending from the shaft. When the CPU package is mounted onto the connector with zero inserted force, the protrusion block is mated with the protrusion to keep the actuator mechanism at a vertical position. The protrusion block increases a strength of the base to protect the base from distortion or damage should it sustain unduly large force.

2 Claims, 6 Drawing Sheets

SOCKET CONNECTOR WITH ACTUATOR MECHANISM MATING MEANS

BACKGROUND OF THE INVENTION

1. Field of the Invention

The present invention relates to a socket connector, and more particularly to a central processing unit (CPU) socket connector for electrically interconnecting a CPU package and a printed circuit board (PCB).

2. Description of the Prior Art

A typical socket connector is adapted to electrically interconnect a PCB and an integrated circuit (IC) package such as a CPU package. Referring to FIG. 8, the socket connector 6 includes a base 60 mounted on the PCB (not shown), a cover 61 carrying the CPU package (not shown) thereon and slidably mounted on the base 60, a plurality of terminals 63 received in the base 60, and an actuator mechanism 62 movably engaged between the base 60 and the cover 61. The base 60 comprises a terminal receiving section 600, and an actuator receiving section 601 extending from one end of the terminal receiving section 600. An array of terminal-passages 6000 is defined in the terminal receiving section 600, for receiving the terminals 63 therein. The actuator receiving section 601 is raised relative to the terminal receiving section 600. An actuator channel 6010 is defined in the actuator receiving section 601, for pivotably securing the actuator mechanism 62 therein. An arcuate positioning cavity 6012 is disposed in the middle of the actuator channel 6010, and a diameter of the arcuate positioning cavity 6012 is greater than that of the actuator channel 6010. A sidewall 6011 is defined at one end of the actuator channel 6010, for preventing the actuator mechanism 62 from moving sideways in the actuator channel 6010. An array of holes 610 is defined in the cover 61 corresponding to the terminal-passages 6000, for insertion of pins of the CPU package therethrough. The actuator mechanism 62 includes a shaft 620, and a handle lever 621 extending perpendicularly from one end of the shaft 620. Cam portions 6200 are formed in the shaft 620, the cam portions 6200 being pivotably received in the actuator channel 6010 of the base 60. A protrusion 6201 is formed in the middle of the cam portion 6200, corresponding to the arcuate positioning cavity 6012. The cover 61 is urged to an open state in which the terminal-passages 6000 are aligned with corresponding holes 610, so that the pins of the CPU package are inserted into the corresponding terminal-passages 6000 with zero insertion force. After that, the cover 61 is urged to a closed state in which the pins mechanically and electrically engage with the corresponding terminals 63. The above features can be found in "Development of ZIF BGA Socket" (CONNECTOR SPECIFIER, May 2000, pp.16~18). Thus good alignment between the holes 610 and the corresponding terminal-passages 6000 is key to assuring insertion of the pins of the CPU package with zero insertion force and avoidance of damage to the pins and the socket connector 6.

In assembling a CPU package onto the connector 6, the handle lever 621 is operated to rotate the shaft 620, so that the cam portions 6200 of the shaft 620 urge the cover 61 into the open state. The protrusion 6201 engages in the arcuate positioning cavity 6012, and makes the handle lever 621 of the actuator mechanism 62 stop at a vertical position. Thus the terminal-passages 6000 are aligned with the corresponding holes 610 to assure insertion of the pins with zero insertion force.

However, the actuator channel 6010 is defined in the actuator receiving section 601, and the arcuate positioning cavity 6012 is disposed in the middle of the actuator channel 6010, with the diameter of the arcuate positioning cavity 6012 being greater than that of the actuator channel 6010. This configuration reduces a strength of the base 60. Therefore, when the socket connector 6 is assembly or used, the base 60 is easily distorted or damaged if it sustains an unduly large force. When this happens, the terminal-passages 6000 are not aligned with the corresponding holes 610. The pins of the CPU package cannot be inserted with zero insertion force, and may be damaged during insertion. Socket connectors having shortcomings similar to those described above in relation to the socket connector 6 can be found in Taiwan Pat. Issue Nos. 502882, 481378, 481375 and 481360.

Thus, there is a need to provide a new socket connector that overcomes the above-mentioned problems.

SUMMARY OF THE INVENTION

Accordingly, one main object of the present invention is to provide a socket connector for electrically interconnecting an IC package with a PCB, wherein an actuator mechanism of the socket connector is accurately positioned to assure insertion of pins of the IC package with zero insertion force during assembly and use.

Another object of the present invention is to provide a socket connector having a strong base.

To fulfill the above-mentioned objects, a socket connector for electrically interconnecting a CPU package with a PCB is provided according to the present invention. The socket connector includes a base, a cover slidably mounted on the base, an actuator mechanism sandwiched between the cover and the base, and a plurality of terminals received in the base. The base defines an actuator channel and an array of terminal-passages for receiving the terminals therein. The actuator channel defines a protrusion block in a middle thereof. The actuator mechanism includes a shaft, and a handle lever extending perpendicularly from one end of the shaft. The shaft defines a protrusion corresponding to the protrusion block of the base. When the CPU package is mounted onto the socket connector with zero inserted force, the protrusion block is mated with the protrusion to keep the actuator mechanism at a vertical position. The protrusion block increases a strength of the base to protect the base from distortion or damage should it sustain unduly large force.

Other objects, advantages and novel features of the present invention will become more apparent from the following detailed description when taken in conjunction with the accompanying drawings, in which:

DESCRIPTION OF PREFERRED EMBODIMENT OF THE INVENTION

Reference will now be made to the drawings to describe the present invention in detail.

Figure 1:
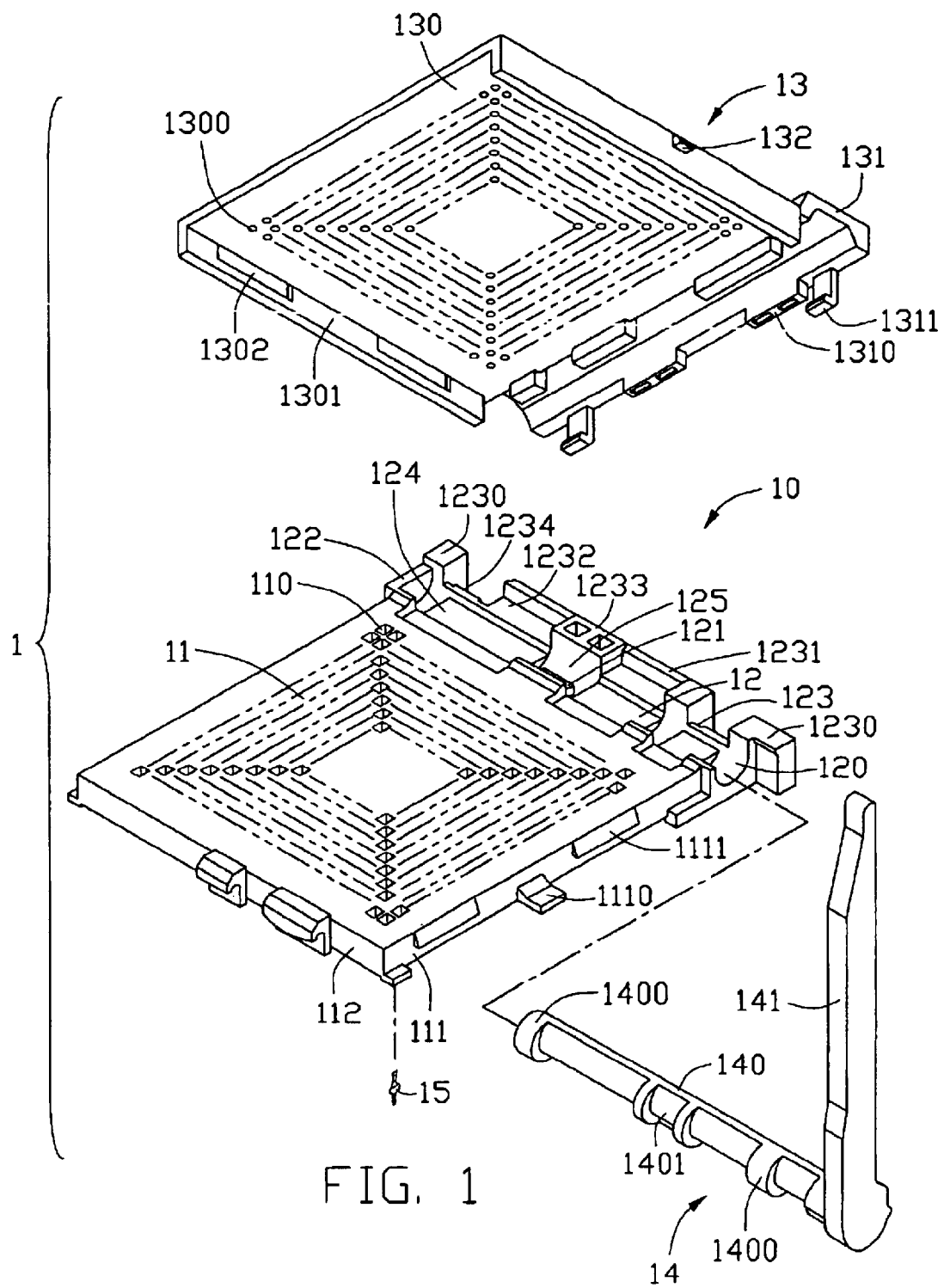
FIG. 1 is a simplified, exploded isometric view of a socket connector according to the present invention.

FIG. 1 is a simplified, exploded isometric view of a socket connector 1 according to the present invention. The socket connector 1 is used to electrically interconnect a PCB and an IC package such as a CPU package (not shown). The socket connector 1 comprises a base 10, a cover 13 slidably mounted on the base 10, an actuator mechanism 14 sandwiched between the cover 13 and the base 10, and a plurality of terminals 15 received in the base 10.

The base 10 is formed from dielectric material such as LCP (liquid crystal polymer) that can endure soldering temperatures, and is substantially a rectangular substrate. The base 2 comprises a terminal receiving section 11, and a first actuator receiving section 12 extending from one end of the terminal receiving section 11. The terminal receiving section 11 defines two opposite first sides 111, and two opposite second sides 112 interconnecting the first sides 111. Two latching blocks 1111 and a first projection 1110 are provided on each first side 111. An array of terminal-passages 110 is defined in the terminal receiving section 11, for receiving corresponding terminals 15 (only one shown) therein. The first actuator receiving section 12 is raised relative to the terminal receiving section 11.

Figure 5:
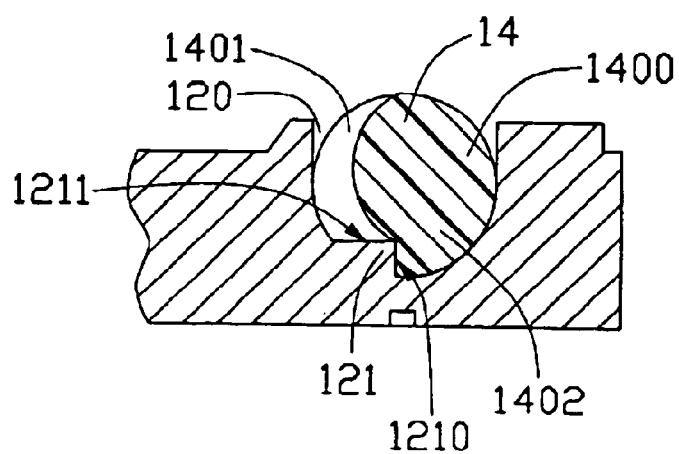
FIG. 5 is a cross-sectional view taken along line V—V of FIG. 4.
Figure 6:
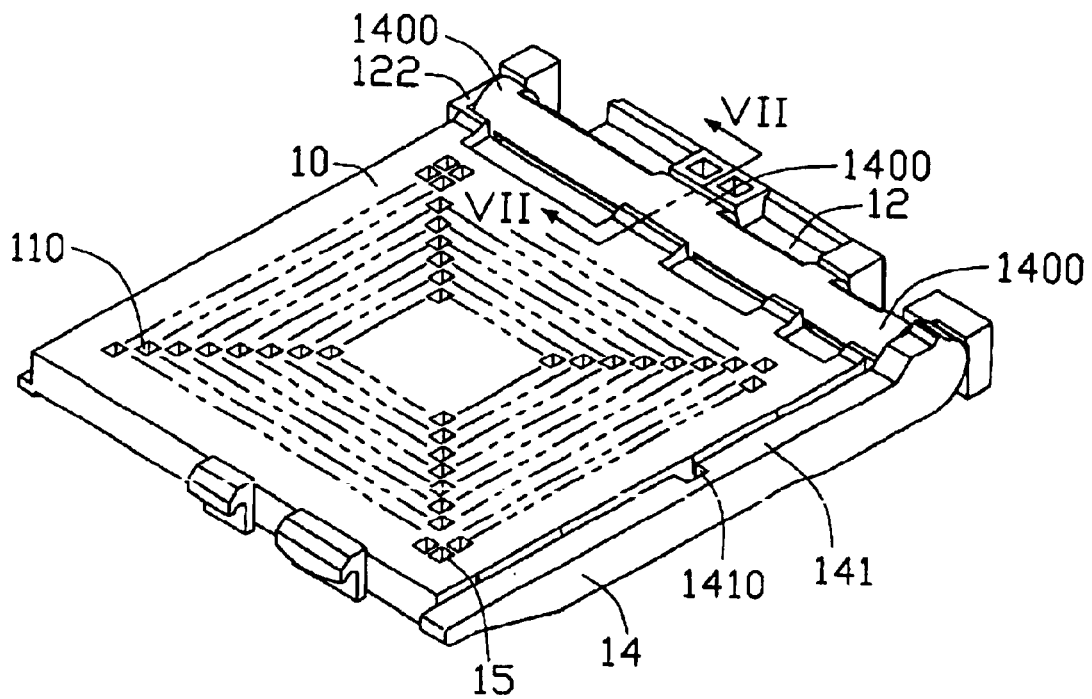
FIG. 6 is similar to FIG. 4, but showing the actuator mechanism at a closed state.
Figure 7:
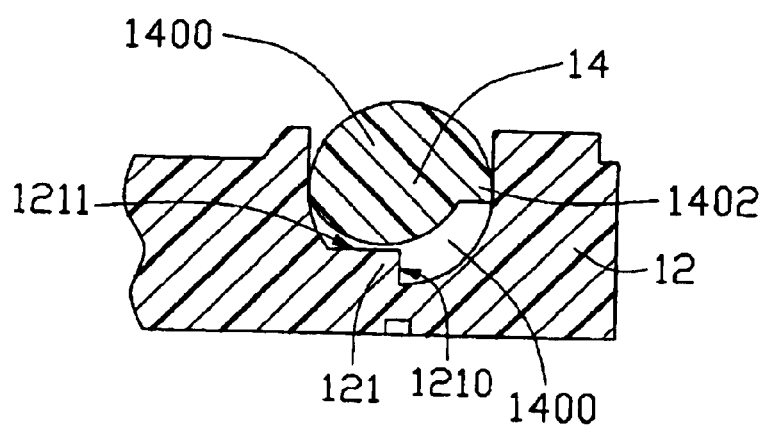
FIG. 7 is a cross-sectional view taken along line VII—VII of FIG. 6.
Figure 8:
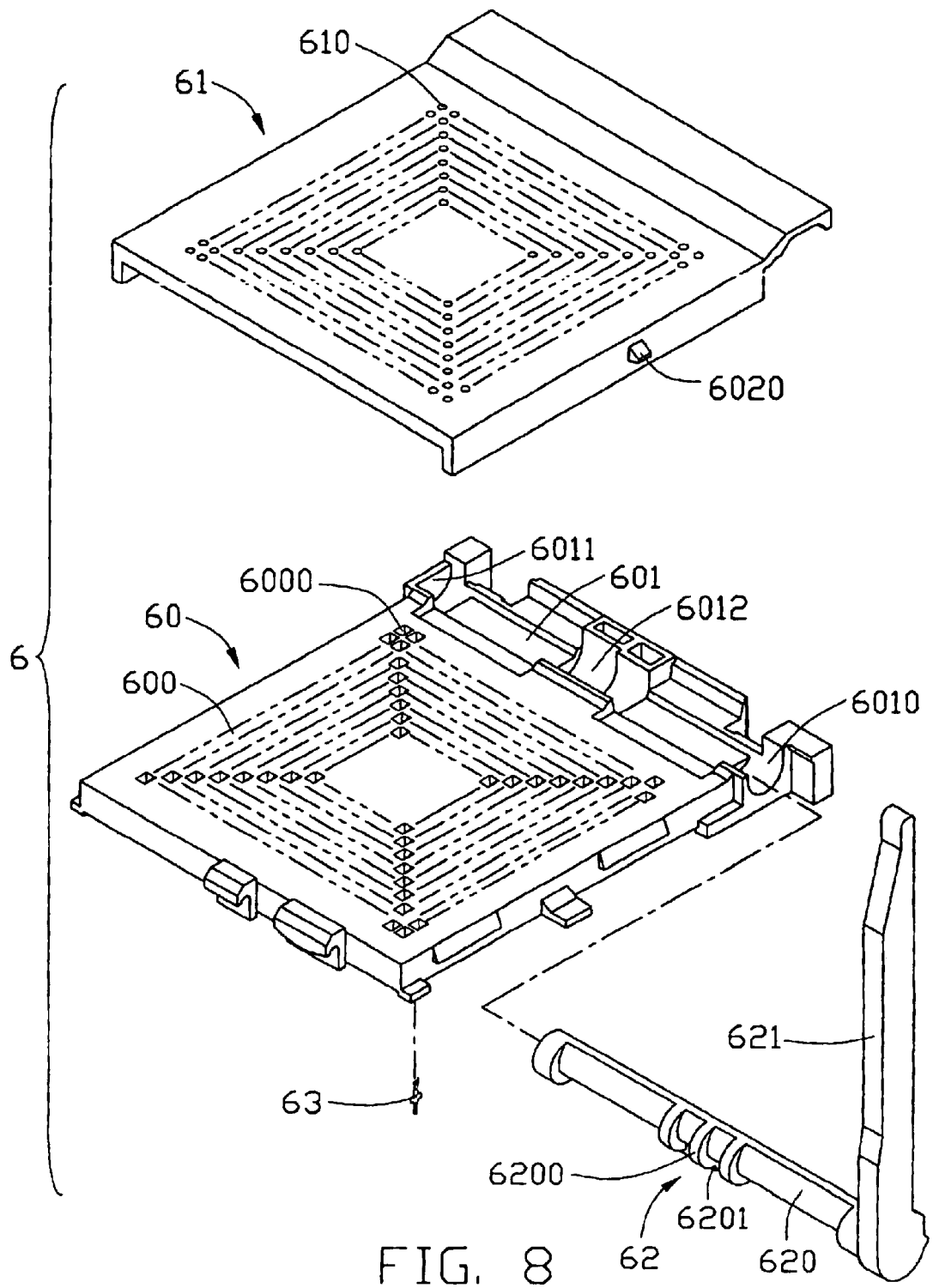
FIG. 8 is a simplified, exploded isometric view of a conventional socket connector.

An actuator channel 120 is defined in the first actuator receiving section 12, for pivotally securing the actuator mechanism 14 therein. The actuator channel 120 has a generally semicircular configuration. The actuator channel 120 comprises trapezoidal actuating cavities 124 and arcuate positioning cavities 125 alternately disposed along a length thereof. A centermost of the positioning cavities 125 has a protrusion block 121 formed therein. First and second stopper surfaces 1210, 1211 (best seen in FIGS. 5 and 7) are defined on the protrusion block 121 parallel to a common axis of the positioning cavities 125. The first and second stopper surfaces 1210, 1211 are perpendicular to each other. A cross-section of the protrusion block 121 is generally triangular. The first actuator receiving section 12 has a third side 123 parallel to the second sides 112. The third side 123 comprises stopper blocks 1230 and an extending portion 1231 alternately disposed along a length thereof, for positioning the actuator mechanism 14 at an open state (to be described hereinafter). A sidewall 122 connecting with one stopper block 1230 is defined at one end of the actuator channel 120, for preventing the actuator mechanism 14 from moving sideways in the first actuator receiving section 12. Two first latching hooks 1234 are formed between the stopper block 1230 and the extending portion 1231. The extending portion 1231 comprises two concave portions 1232 and a first connecting portion 1233 alternately disposed along a length thereof.

The cover 13 is also formed from dielectric material such as LCP that can endure soldering temperatures, and is substantially a rectangular substrate. The cover 13 comprises a hole section 130 and a second actuator receiving section 131, respectively corresponding to the terminal receiving section 11 and the first actuator receiving section 12 of the base 10. The second actuator receiving section 131 is raised relative to the hole section 130. An array of holes 1300 is defined in the hole section 130 corresponding to the terminal-passages 110, for insertion of pins of the CPU package (not shown) therethrough. Two lateral side walls 1301 depend from opposite lateral sides of the hole section 130 respectively. Each side wall 1301 defines latching recesses 1302, which receive corresponding latching blocks 1111 therein when the cover 13 is mounted on the base 10. A second projection 132 is defined in one side wall 1301 corresponding to the first projection 1110, for receipt of the actuator mechanism 14 between the base 10 and the cover 13. The second actuator receiving section 131 defines a mounting portion 1310 and second latching hooks 1311, for receiving the corresponding concave portions 1232 and the first latching hooks 1234 therein to securely mount the cover 13 onto the base 10.

Figure 2:
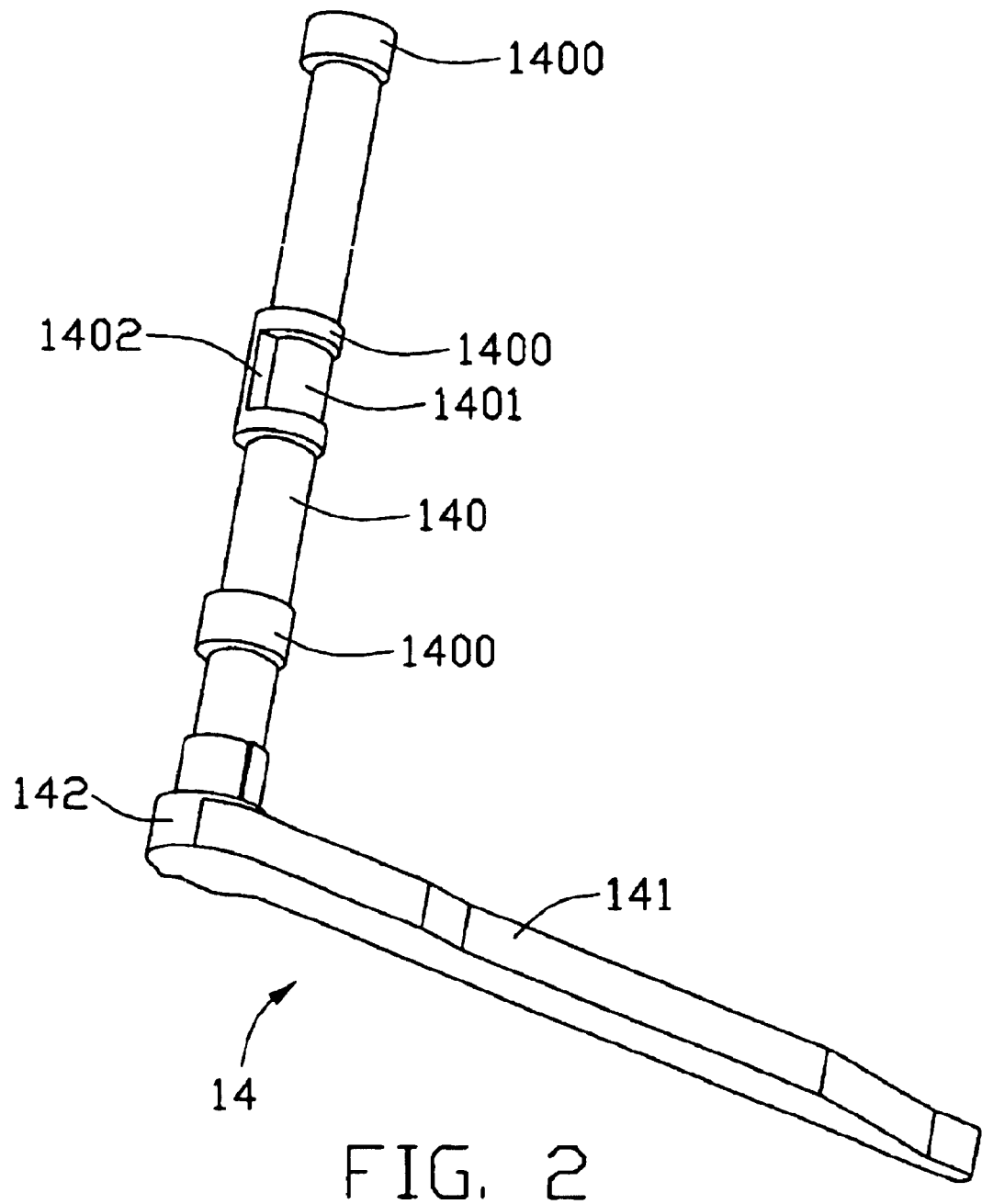
FIG. 2 an enlarged, isometric view of an actuator mechanism of the socket connector of FIG. 1, viewed from another aspect.
Figure 3:
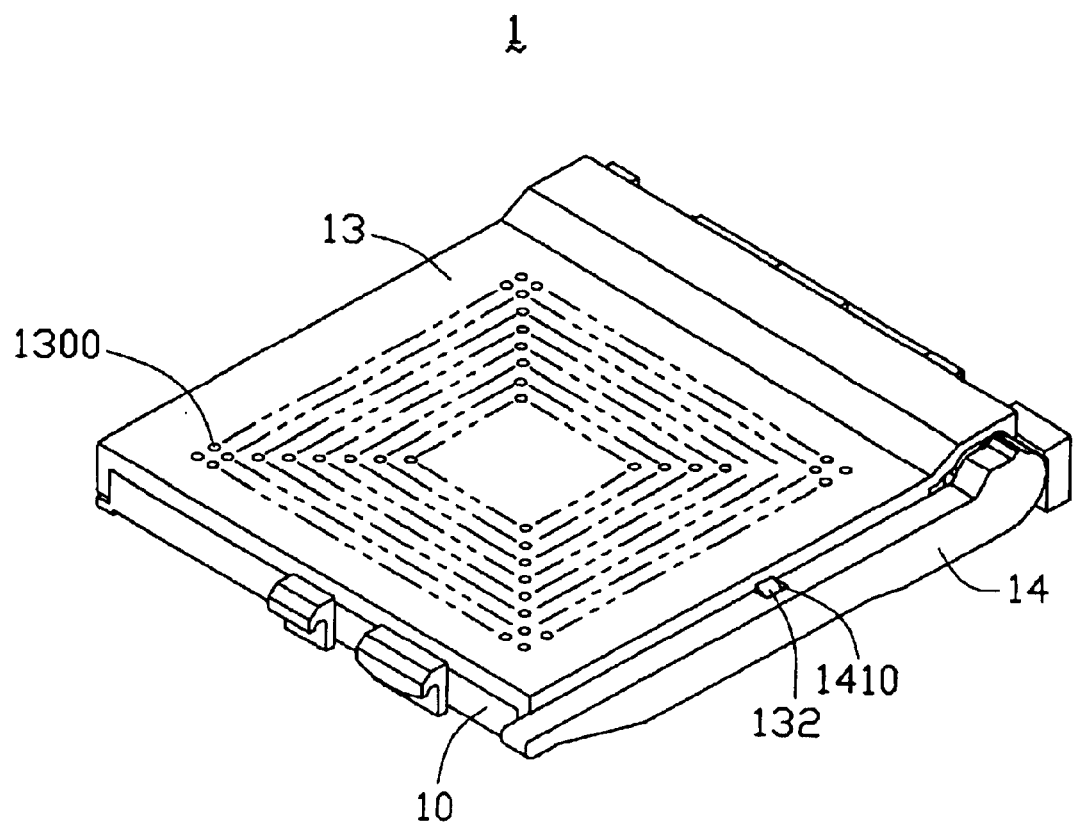
FIG. 3 is an assembled view of FIG. 1, showing a cover of the socket connector at a closed state.
Figure 4:
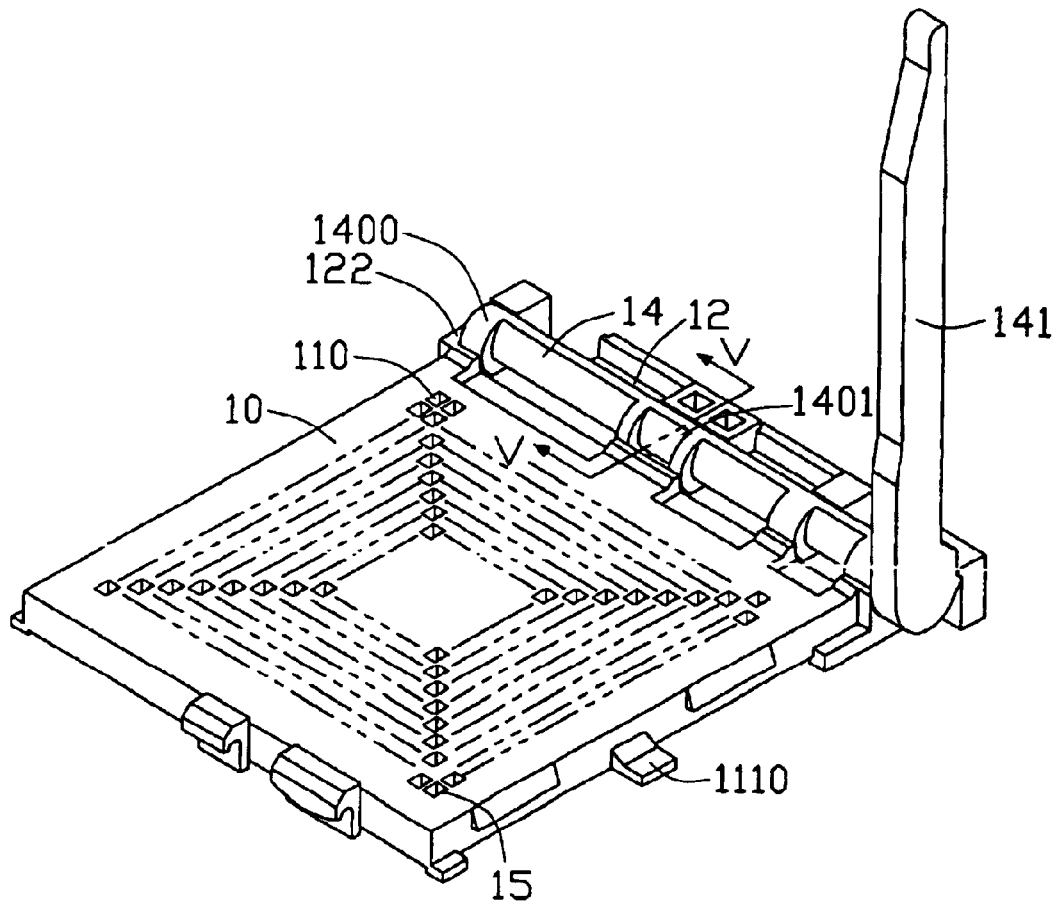
FIG. 4 is an assembled view of a base and the actuator mechanism of the socket connector of FIG. 1, showing the actuator mechanism at an open state.

Referring to FIGS. 1, 2 and 3, the actuator mechanism 14 is pivotally sandwiched between the cover 13 and the base 10, and has a substantially "L"-shaped configuration. The actuator mechanism 14 comprises a shaft 140, a handle lever 141 extending perpendicularly from one end of the shaft 140, and a second connecting portion 142 interconnecting the shaft 140 and the handle lever 141. Positioning portions 1400 and stopper portions 1401 are formed on the shaft 140 in alternate fashion, for being received in the positioning cavities 125 and the actuating cavities 124 respectively. A protrusion 1402 is formed between the two positioning portions 1400 in the middle of the shaft 140, corresponding to the protrusion block 121 of the base 10. The positioning portion 1400 at one end distal from the handle lever 141 mounts onto the sidewall 122 of the actuator receiving section 12, for preventing the shaft 140 from moving sideways in the base 10. The handle lever 141 forms a recessed portion 1410 (best seen in FIG. 3) corresponding to both the first projection 1110 of the base 10 and the second projection 132 of the cover 13. A diameter of the second connecting portion 142 is greater than that of the shaft 140.

In assembly, the positioning portions 1400 and the stopper portions 1401 are received in the actuating cavities 124 and the positioning cavities 125 respectively. Then the cover 13 is mounted on the base 10. The first latching hooks 1234 respectively ride over and snappingly engage with the second latching hooks 1311. The latching recesses 1302 receive the corresponding latching blocks 1111. The mounting portions 1310 are received in the corresponding concave portions 1232. Thus the actuator mechanism 14 is pivotably sandwiched between the cover 13 and the base 10. The shaft 140 can rotate about its own axis in the actuator channel 120 by operating the handle lever 141, for driving the cover 13 to slide relative to the base 10 between the open state and a closed state. The recessed portion 1410 is receivable between the first projection 1110 of the base 10 and the second projection 132 of the cover 13.

Referring to FIGS. 3–7, when the CPU package is mounted onto the socket connector 1, the cover 13 is urged to the open state. In the open state, the terminal-passages 110 are aligned with the corresponding holes 1300, and the stopper block 1230 stops the second connecting portion 142 and orients the handle lever 141 at a substantially vertical position perpendicular to the cover 13. Additionally, the protrusion 1402 presses on the first stopper surface 1210 of the protrusion block 121. The handle lever 141 is thereby prevented from being over-rotated, so that the cover 13 is securely located at the open state. As a result, the pins are inserted in the terminal-passages 110 through the corresponding holes 1300 accurately and safely. Zero insertion force of the pins is assured, and damage to the base 10 and the cover 13 is avoided.

The handle lever 141 is then rotated to a substantially horizontal position parallel to the cover 13. The protrusion 1402 moves away from the first stopper surface 1210 of the protrusion block 121. The cover 13 is then urged to the closed state in which the pins are pushed by the cover 13 to mechanically and electrically engage with the corresponding terminals 15. Simultaneously, the recessed portion 1410 of the handle lever 141 is received between the first projection 1110 of the base 10 and the second projection 132 of the cover 13 to prevent the handle lever 141 from springing back. Therefore damage to the base 10 and the cover 13 is avoided. In addition, the protrusion block 121 of the first actuator receiving section 12 increases a strength of the base 10 and protects the base 10 from distortion or damage during use.

Although the present invention has been described with reference to a particular embodiment, it is not to be construed as being limited thereto. Various alterations and modifications can be made to the embodiment without in any way departing from the scope or spirit of the present invention as defined in the appended claims.

What is claimed is:

1. A socket connector comprising:
   a base having a terminal receiving section and an actuator receiving section, the terminal receiving section defining a plurality of terminal-passages;
   a cover slidably mounted on the base;
   a plurality of terminals received in the corresponding terminal passages; and
   an actuator mechanism including a handle lever and a shaft, the shaft received in the actuator receiving section;
   wherein the actuator receiving section defines a mating member, the shaft defines a mating means to mate with the mating member so as to avoid over-movement of the cover relative to the base,
   wherein a cross-section of the mating member is generally triangular;
   wherein the handle lever extends perpendicularly from one end of the shaft, and a connecting portion interconnects the shaft and the handle lever;
   wherein a diameter of the connecting portion is greater than that of the shaft;
   wherein the handle lever comprises a recessed portion;
   wherein the shaft forms stopper portions and positioning portions;
   wherein the actuator receiving section defines an actuator channel, the actuator channel comprising actuating cavities and positioning cavities;
   wherein the actuator channel has a generally semicircular configuration;
   Wherein the mating means is a protrusion defined between two positioning portions in the middle of the shaft;
   wherein the mating member is a protrusion block disposed in one of the positioning cavities of the base;
   wherein first and second stopper surfaces are defined on the protrusion block parallel to a common axis of the positioning cavities;
   wherein the cover defines a hole section corresponding to the terminal receiving section of the base, the hole section defining a plurality of holes corresponding to the terminal-passages.

2. An electrical socket comprising:
   a base defining a terminal receiving section and an actuator receiving section;
   a plurality of terminal-passages formed in said terminal receiving section;
   a cover slidably mounted on the base;
   a plurality of terminals received in the corresponding terminal-passages, respectively;
   an actuator mechanism including a handle, and a cam shaft received in the actuator receiving section; wherein the actuator receiving section defines a positioning cavity with a protruding block therein, and the cam shaft defines a pair of spaced positioning portions which are received in the positioning cavity and sandwich said protruding block along an axial direction of said cam shaft.
   wherein said protruding block defines a stopper surface which abuts against another stopper surface provided on the cam shaft between said pair of spaced positioning portions;
   wherein engagement between said stopper surface and said another stopper surface occurs when said cover is in an open position with regard to the base.

* * * * *